US006385074B1

(12) United States Patent
Johnson et al.

(10) Patent No.: US 6,385,074 B1
(45) Date of Patent: May 7, 2002

(54) INTEGRATED CIRCUIT STRUCTURE INCLUDING THREE-DIMENSIONAL MEMORY ARRAY

(75) Inventors: Mark G. Johnson, Los Altos; Thomas H. Lee, Cupertino; Vivek Subramanian, Redwood City; Paul Michael Farmwald, Portola Valley; James M. Cleeves, Redwood City, all of CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 09/748,816

(22) Filed: Dec. 22, 2000

Related U.S. Application Data

(60) Continuation-in-part of application No. 09/469,658, filed on Dec. 22, 1999, now Pat. No. 6,185,122, which is a division of application No. 09/192,883, filed on Nov. 16, 1998, now Pat. No. 6,034,882.

(51) Int. Cl.[7] .............................................. G11C 17/00

(52) U.S. Cl. .................. 365/103; 365/230.06; 365/130

(58) Field of Search .......................... 365/103, 63, 52, 365/225.7, 130, 230.06, 226

(56) References Cited

U.S. PATENT DOCUMENTS 3,576,549 A 4/1971 Hess et al. ............ 340/173 SP
3,582,908 A 6/1971 Koo .......................... 340/173
3,634,929 A 1/1972 Yoshida et al. .............. 29/577
3,671,948 A 6/1972 Cassen et al. ......... 340/173 SP
3,717,852 A 2/1973 Abbas et al. .......... 340/173 SP
3,728,695 A 4/1973 Frohman- Bentchkowsky .. 340/173 R
3,787,822 A 1/1974 Rioult .................. 340/173 SP
3,863,231 A 1/1975 Taylor .................. 340/173 SP
3,990,098 A 11/1976 Mastrangelo ................. 357/2
4,146,902 A 3/1979 Tanimoto et al. .............. 357/6
4,203,123 A 5/1980 Shanks .......................... 357/2
4,203,158 A 5/1980 Frohman-Bentchkowsky et al. ... 365/185
4,229,757 A 10/1980 Moussie ...................... 357/59
4,272,880 A 6/1981 Pashley ....................... 29/571
4,281,397 A 7/1981 Neal et al. .................. 365/189
4,419,741 A 12/1983 Stewart et al. ................ 365/72

(List continued on next page.)

OTHER PUBLICATIONS

U.S. Pat. application No. 09/748,815, files Dec. 22, 2000, entitled "Charge Pump Circuit," naming inventors Mark G. Johnson, Joseph G. Nolan III, and Matthew P. Crowle, p. 39.
U.S. Pat. application No. 09/560,626, filed Apr. 28, 2000, entitled "Three–Dimensional Memory Array and Method of Fabrication," naming inventor N. Johan Knall, p. 48.

*Primary Examiner*—David Nelms
*Assistant Examiner*—Thong Le
(74) *Attorney, Agent, or Firm*—Zagorin, O'Brien & Graham, LLP

(57) ABSTRACT

An integrated circuit device includes a three-dimensional memory array and array terminal circuitry for providing to selected memory cells of the array a write voltage different from a read voltage. Neither voltage is necessarily equal to a VDD power supply voltage supplied to the integrated circuit. The write voltage, particularly if greater than VDD, may be generated by an on-chip voltage generator, such as a charge pump, which may require an undesirably large amount of die area, particularly relative to a higher bit density three-dimensional memory array formed entirely in layers above a semiconductor substrate. In several preferred embodiments, the area directly beneath a memory array is advantageously utilized to layout at least some of the write voltage generator, thus locating the generator near the selected memory cells during a write operation.

51 Claims, 4 Drawing Sheets

U.S. PATENT DOCUMENTS 4,420,766 A 12/1983 Kasten ........................ 357/29
4,442,507 A 4/1984 Roesner ...................... 365/100
4,489,478 A 12/1984 Sakurai ....................... 29/574
4,494,135 A 1/1985 Moussie ...................... 357/59
4,498,226 A 2/1985 Inoue et al. .............. 29/576 B
4,499,557 A 2/1985 Holmberg et al. .......... 365/163
4,507,757 A 3/1985 McElroy ..................... 365/104
4,543,594 A 9/1985 Mohsen et al. ............... 357/51
4,569,121 A 2/1986 Lim et al. ..................... 29/574
4,646,266 A 2/1987 Ovshinsky et al. ......... 365/105
4,820,657 A 4/1989 Hughes et al. .............. 437/172
4,823,181 A 4/1989 Mohsen et al. ............... 357/51
4,855,953 A 8/1989 Tsukamoto et al. ......... 365/149
4,876,220 A 10/1989 Mohsnen et al. ........... 437/170
4,881,114 A 11/1989 Mohsen et al. ............... 357/54
4,899,205 A 2/1990 Hamdy et al. ................ 357/51
4,922,319 A 5/1990 Fukushima .................. 357/51
4,943,538 A 7/1990 Mohsen et al. ............... 437/52
5,070,383 A 12/1991 Sinar et al. ................... 357/51
5,070,384 A 12/1991 McCollum et al. ........... 357/51
5,126,290 A 6/1992 Lowrey et al. ............. 437/235
B14,203,158 A 9/1992 Frohman-Bentchkowsky et al. ... 365/185
5,233,206 A 8/1993 Lee et al. ..................... 257/50
5,306,935 A 4/1994 Esquivel et al. ............ 257/315
5,311,039 A 5/1994 Kimura et al. ................ 257/50
5,334,880 A 8/1994 Abadeer et al. ............ 307/219
5,391,518 A 2/1995 Bhushan ..................... 437/190
5,427,979 A 6/1995 Chang ........................ 437/190
5,441,907 A 8/1995 Sung et al. ................... 437/48
5,463,244 A 10/1995 De Araujo et al. ......... 257/530
5,467,305 A 11/1995 Bertin et al. ........... 365/185.01
5,508,971 A 4/1996 Cernea et al. ......... 365/185.23
5,535,156 A 7/1996 Levy et al. ................. 365/175
5,536,968 A 7/1996 Crafts et al. ................ 257/529
5,596,532 A 1/1997 Cernea et al. ......... 365/185.18
5,640,343 A 6/1997 Gallagher et al. .......... 365/171
5,675,547 A 10/1997 Koga .................... 365/230.03
5,737,259 A 4/1998 Chang ........................ 365/105
5,745,407 A 4/1998 Levy et al. ................. 365/159
5,751,012 A 5/1998 Wolstenholme et al. ....... 257/5
5,751,629 A * 5/1998 Nova et al. ................. 365/151
5,776,810 A 7/1998 Guterman et al. .......... 438/258
5,793,697 A 8/1998 Scheuerlein ........... 365/230.07
5,818,748 A * 10/1998 Bertin et al. .................. 365/51
5,835,396 A 11/1998 Zhang ......................... 365/51
5,883,409 A 3/1999 Guterman et al. .......... 257/316
6,034,882 A 3/2000 Johnson et al. ............. 365/103
6,055,180 A 4/2000 Gudesen et al. ............ 365/175
6,185,122 B1 2/2001 Johnson et al. ............. 365/103

* cited by examiner

INTEGRATED CIRCUIT STRUCTURE INCLUDING THREE-DIMENSIONAL MEMORY ARRAY

CROSS-REFERENCE TO RELATED APPLICATION(S)

This application is a continuation-in-part of commonly-assigned application Ser. No. 09/469,658, filed Dec. 22, 1999, now U.S. Pat. No. 6,185,122, entitled "Vertically Stacked Field Programmable Non-Volatile Memory and Method of Fabrication" and naming Mark G. Johnson, Thomas IT. Lee, Vivek Subramanian, Paul Michael Farmwald, and James M. Cleeves as inventors, which is incorporated herein by reference in its entirety, and which is a divisional of application Ser. No 09/192,883, filed Nov. 16, 1998, now U.S. Pat. No. 6,034,882, entitled "Vertically Stackcd Field Programmable Non-Volatile Memory and Method of Fabrication" and naming Mark G. Johnson, Thomas H. Lee, Vivek Subramanian, Paul Michael Farmwald, and James M. Cleeves as inventors, which is incorporated herein by reference in its entirety.

BACKGROUND OF THE INVENTION

1. Field of the Invention

The present invention relates to semiconductor integrated circuits having memory cell arrays, and particularly to three-dimensional arrays incorporating multiple levels of memory cells.

2. Description of the Related Art

Semiconductor memories often use two different voltages to perform the read and write operations. In some memory technologies, particularly nonvolatile memories (i.e., memories having data stored which is not lost or altered when power is removed), the write voltage is often higher than the read voltage, with sufficient margin between the two voltages to ensure that memory cells are not written unintentionally when subjected to the read voltage.

Flash memories create a non-volatile state by accelerating electrons across a tunneling dielectric and storing the charge on a floating gate above a field effect transistor. On many earlier-developed devices, this acceleration of charge across the tunneling dielectric frequently required a voltage on the order of 12 volts. The remainder of the operations of the memory circuitry frequently required a voltage on the order of 5 volts, including reading the memory cells. Some commercially available devices required two different power supply voltages be supplied to operate the device. For example, a first power supply voltage equal to +5 volts (relative to "ground" or VSS) was typically utilized to power the normal read operation circuits, and was frequently called VDD. A second power supply voltage equal to +12 volts (also relative to VSS) was typically utilized to provide the write voltage for writing to the memory cells, and was frequently called VPP. Other commercially available devices require a single power supply voltage (e.g., VDD) to power the normal read operation, but include circuits to internally generate a write voltage, greater in magnitude than VDD, without requiring a separate power supply voltage be supplied by a user of the device.

As lower-voltage technologies have been developed, the magnitudes of the read voltage and the write voltage have both decreased. Read voltages of the order of 2.5–3.3 volts, and write voltages of the order of 8 volts, are more frequently encountered in more recently developed devices.

Other types of memory devices, including some volatile memories (i.e., having data stored which is typically lost when power is removed) utilize a write voltage which is different from its read voltage. For example, some static random access memory devices (SRAMs) provide a write voltage above VDD for writing to selected memory cells. Such devices are typically arranged to drive a selected word line during a write cycle to the write voltage which is above VDD, yet drive a selected word line during a read cycle to a lesser read voltage, such as VDD, or a voltage even lower than VDD.

While on-chip voltage generator circuits may relieve a user from supplying a second power supply voltage, such circuits frequently require a significant amount of layout area to implement, which may increase die size substantially, and consequently increase costs. Moreover, such voltage generator circuits also may consume a significant amount of power relative to the remainder of the circuit, and thus increase the current that must be supplied by the user (e.g., by the VDD power supply). Any increase in power dissipation may also increase the temperature of the die during operation. In a battery-powered environment, any increase in power consumed by a memory device may have significant implications for battery life, and any additional heat generated may also be difficult to dissipate. Consequently, continued improvements are desired, particularly as memory technology achieves continued advancements in bit density.

SUMMARY OF THE INVENTION

In an integrated circuit incorporating a three-dimensional memory array, vastly higher bit densities may be achieved compared to other types of memory arrays. Traditional implementations of on-chip voltage generators, such as charge pumps, may consume an undesirably large amount of die area, particularly relative to a higher bit density memory array. In one embodiment of the present invention incorporating a three-dimensional memory array formed entirely in layers above a semiconductor substrate, the area required to implement an on-chip voltage generator is reduced by laying out at least some of the voltage generator directly beneath the memory array.

In one preferred embodiment of the present invention, an integrated circuit device includes a three-dimensional memory array formed entirely in layers above a semiconductor substrate, and further includes array terminal circuitry for providing to one or more selected memory cells of the array a write voltage different from a read voltage. Neither voltage is necessarily equal to a VDD power supply voltage supplied to the integrated circuit. The write voltage, particularly if greater than VDD, may be generated by an on-chip voltage generator. At least a portion of the write voltage generator is preferably implemented beneath the memory array, thus locating the write voltage generator near the selected memory cells without negatively impacting stacking of adjacent memory sub-arrays.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
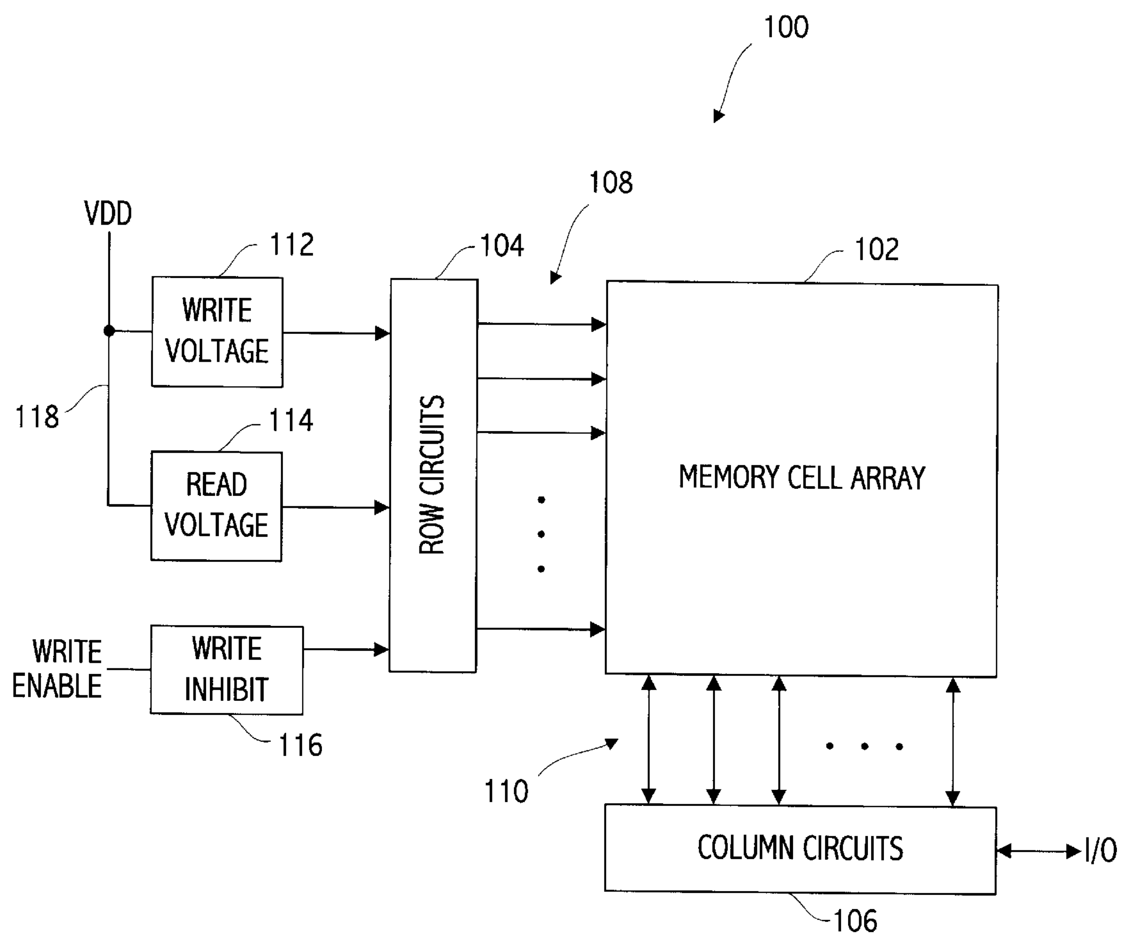
FIG. 1 is a block diagram of an integrated circuit including a memory array in accordance with the present invention.

Referring now to FIG. 1, a block diagram is shown of an integrated circuit 100 including a memory array 102, which diagram may be useful to depict several preferred embodiments of the present invention. In one such embodiment, the memory array 102 is preferably a three-dimensional, field-programmable, non-volatile memory array having more than one level of memory cells, and also utilizing a read voltage different in magnitude from a write voltage. Preferred three-dimensional memory arrays are disclosed in commonly-assigned U.S. Pat. No. 6,034,882, entitled "Vertically Stacked Field Programmable Nonvolatile Memory and Method of Fabrication." Another preferred three-dimensional, non-volatile memory array technology is disclosed in co-pending, commonly-assigned U.S. application Ser. No. 09/560,626, entitled "Three-Dimensional Memory Array and Method of Fabrication," filed Apr. 28, 2000 and naming as inventor N. Johan Knall, which application is incorporated herein by reference in its entirety.

In the presently described preferred embodiment, array 102 is a three-dimensional non-volatile write-once memory array, although other memory arrays are also suitable. Each memory cell within the memory array 102 is preferably a two-terminal memory cell having a steering element in series with a state change element, together connected between two usually orthogonal (but not necessarily so) array terminal lines, as described in the above-cited references. These two elements within a memory cell may both be present before programming. Alternatively, the steering element within a given memory cell may be formed during programming of the memory cell. Suitable state change elements include those having a significant change of resistance, including both fuses and antifuses. A memory cell whose state change element is an antifuse may be termed an antifuse memory cell, whereas a memory cell whose state change element is a fuse may be termed a fuse memory cell.

The array terminal lines at one level may be termed word lines or X-lines. The array terminals at a vertically adjacent level may be termed bit lines or Y-lines. A memory cell is formed at the intersection of each word line and each bit line, and is connected between the respective intersecting word line and bit line. A three-dimensional memory array which has at least two levels of memory cells may utilize at least more than one layer of word lines or more than one layer of bit lines. A group of word lines, each residing on a separate layer and substantially vertically-aligned (notwithstanding small lateral offsets on some layers), may be collectively termed a row. The word lines within a row preferably share at least a portion of the row address. Similarly, a group of bit lines, each residing on a separate layer and substantially vertically-aligned (again, notwithstanding small lateral offsets on some layers), may be collectively termed a column. The bit lines within a column preferably share at least a portion of the column address.

The array terminals of memory array 102 include the various layer(s) of word lines organized as rows, and the various layer(s) of bit lines organized as columns. The integrated circuit 100 includes a row circuits block 104 whose outputs 108 arc connected to respective word lines of the memory array 102. The row circuits block 104 typically may include such circuits as row decoders and array terminal drivers for both read and write operations. The integrated circuit 100 also includes a column circuits block 106 whose input/outputs 110 are connected to respective bit lines of the memory array 102. The column circuits block 106 typically may include such circuits as column decoders, array terminal receivers, read/write circuitry, and I/O multiplexers. Circuits such as the row circuits block 104 and the column circuits block 106 may be collectively termed array terminal circuits for their connection to the various terminals of the memory array 102.

A write voltage generator 112 receives a power supply voltage VDD and generates a write voltage, which is then conveyed to the row circuits block 104. During a write operation, the row circuits block 104 couples this write voltage into the memory array 102 for programming one or more selected memory cells. The write voltage may be equal to the VDD voltage, less than the VDD voltage, or greater than the VDD voltage as suits the memory array technology and the choice of the VDD power supply voltage, although preferably the write voltage is substantially greater than the VDD voltage. For example, for a VDD voltage on the order of 2.0–3.5 volts, a write voltage on the order of 6–12 volts may be advantageous. More particularly, for a VDD voltage on the order of 2.5–3.3 volts, a write voltage on the order of 7–8 volts may be preferred.

The write voltage generator 112 is preferably a capacitive voltage multiplier circuit, many forms of which are well known in the art, and which are frequently termed charge pump circuits. Many of these well-known charge pump circuits are suitable for the present invention. Preferred charge pump circuits are disclosed in co-pending commonly-assigned U.S. Pat. application Ser. No. 09/748,815 entitled "Charge Pump Circuit," filed on even date herewith, naming Mark G. Johnson, Joseph G. Nolan, III, and Matthew P. Crowley as inventors, which application is incorporated herein by reference in its entirety. Other types of voltage generator circuits, such as an inductive voltage transformation circuit, may also be suitable, although such circuits may be more difficult to integrate than a capacitive voltage multiplier circuit.

In some embodiments, an optional read voltage generator 114 receives a power supply voltage such as VDD and generates a read voltage, which is then conveyed to the row circuits block 104. During a read operation, the row circuits block 104 couples this read voltage into the memory array 102 for reading one or more selected memory cells. The read voltage may be equal to the VDD voltage, less than the VDD voltage, or greater than the VDD voltage as suits the memory array technology and the choice of power supply voltage VDD, although preferably the read voltage is less than or equal to the VDD voltage. The voltage generator 114, if used, may take any of a variety of suitable forms well known in the art, including various reference voltage generators such bandgap generators, voltage dividers, and series-pass element linear regulators with linear feedback. Alternatively, the read voltage may be generated directly by operation of the row circuits block 104, and a separate voltage generator 114 not required. For example, the read voltage conveyed to the memory array 102 by the row circuits block 104 may be equal to VDD, or may be a threshold voltage below VDD, or some other voltage, and may be generated by traditional CMOS decoder and driver circuits.

In some embodiments, a write inhibit block 116 may be used to inhibit a write enable signal from reaching or otherwise activating or enabling the row circuits block 104 for write, thus blocking subsequent alteration of memory cells (e.g., write or erase operations) after the memory array 102 is written. If the memory array 102 is an erasable memory array, such a write inhibit may function as a write-protect lock and prevent any subsequent erasure and/or re-writing of the memory array. Even if the memory array 102 is a write-once memory array, such a write inhibit may function as a write-protect lock and prevent any subsequent over-writing of already programmed memory cells, or prevent any programming of additional memory cells in the memory array.

The write inhibit block 116, if incorporated, may take any of several useful forms, such as a programmable bit which, once programmed, inhibits the row circuits block 104 from passing the write voltage to any terminal of the array 102, and thus prevents any memory cells from being written. Such a write inhibit capability may be implemented using a programmable bit that incorporates the same technology as the memory array 102, or may be implemented using a different technology, such as a laser programmable fuse or antifuse, an electrically programmable fuse or antifuse, and even an externally selectable input pin to disable any write or programming operation. Such a write inhibit capability need not require a distinct circuit block. For example, this functionality could be implemented into the row circuits block 104, or alternatively, could disable the write voltage generator 112 to block subsequent write operations.

Figure 2:
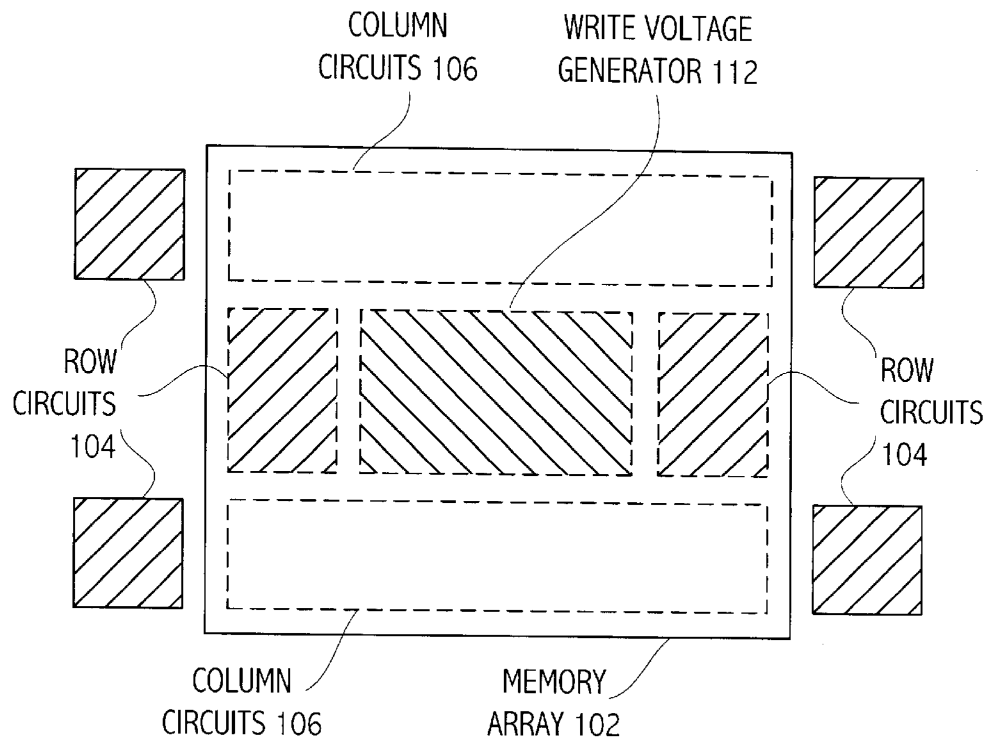
FIG. 2 is a block diagram of a physical layout arrangement of a memory array and associated circuitry, including an on-chip voltage generator, in accordance with a preferred embodiment of the present invention.

Referring now to FIG. 2, an integrated circuit layout is depicted which shows the write voltage generator 112 located generally in the center of, and beneath, the memory array 102. As more fully described in U.S. Pat. 6,034,882, the column circuits block 106 is preferably implemented in two halves, each serving alternate columns of bit lines, and are each shown located beneath the memory array 102 and labeled as 106. Similarly, the row circuits block 104 is also preferably implemented in two halves, each serving alternate rows of word lines. The row circuits block located to the right of the memory array 102 is partitioned into three sections, each shown and labeled as 104, with one section located beneath the memory array 102 and two sections located outside the lateral extent of the memory array 102. The row circuits block located to the left of the memory array 102 is likewise partitioned one section located beneath the memory array 102 and two sections located outside the lateral extent of the memory array 102. The preferred stacking of many sub-arrays, each arranged as shown in FIG. 2, into a larger memory array is also described in U.S. Pat. No. 6,034,882.

Even with placing the row circuits block 104 and column circuits block 106 largely beneath the memory array 102, there may be additional area unused beneath the memory array 102, depending upon the relative sizes of the various blocks. Since a write voltage generator 112 is frequently a large circuit which takes up a considerable amount of layout area on the integrated circuit, the write voltage generator 112 is preferably located, at least in part, beneath the memory array 102. Other peripheral circuits that may be incorporated within the integrated circuit may be far more difficult to locate beneath the memory array since most connections to such peripheral circuits are frequently distant from the memory array.

Locating such a write voltage generator 112 close to the memory array 102 more easily affords a low resistance current path for programming current to flow from the voltage generator 112 to the row circuits block 104, and ultimately to the selected memory cell(s). Placing the write voltage generator 112 beneath the memory array 102, rather than adjacent to the memory array 102, allows adjacent memory arrays or sub-arrays to be stacked more closely together. Compared to locating the write voltage generator 112 outside a tightly stacked group of sub-arrays, the programming current (i.e., current from the write voltage generator) may also be carried by a smaller wire size without undesirable voltage drops which otherwise negatively impact the write operation of the memory array.

Figure 3:
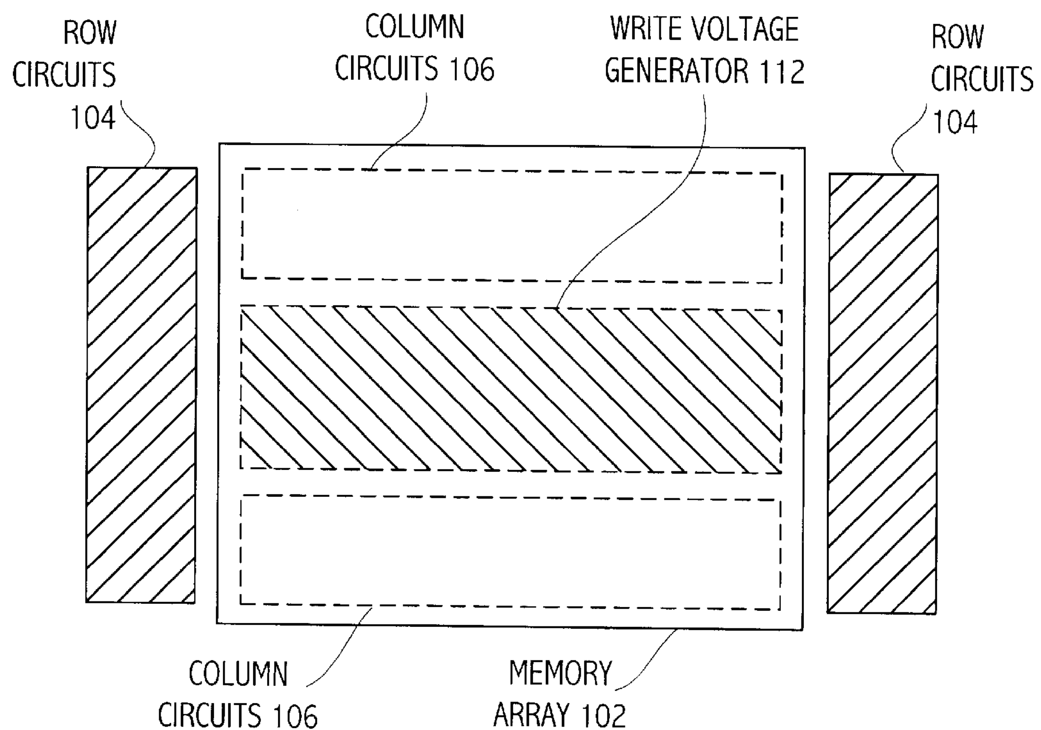
FIG. 3 is a block diagram of a physical layout arrangement of a memory array and associated circuitry, including an on-chip voltage generator, in accordance with a preferred embodiment of the present invention.

Referring now to FIG. 3, another embodiment of an integrated circuit layout is depicted which shows the voltage generator 112 generally in the center of, and beneath, the memory array 102. The column circuits blocks 106 are implemented in two halves, as before, each located beneath the memory array 102. The row circuits block 104 is implemented in two halves, as before, but in this embodiment each half is implemented in a single block located entirely outside the lateral extent of the memory array 102. By moving the row circuits block 104 outside the extent of the memory array 102, additional layout area may be allocated for use by the write voltage generator 112.

Figure 4:
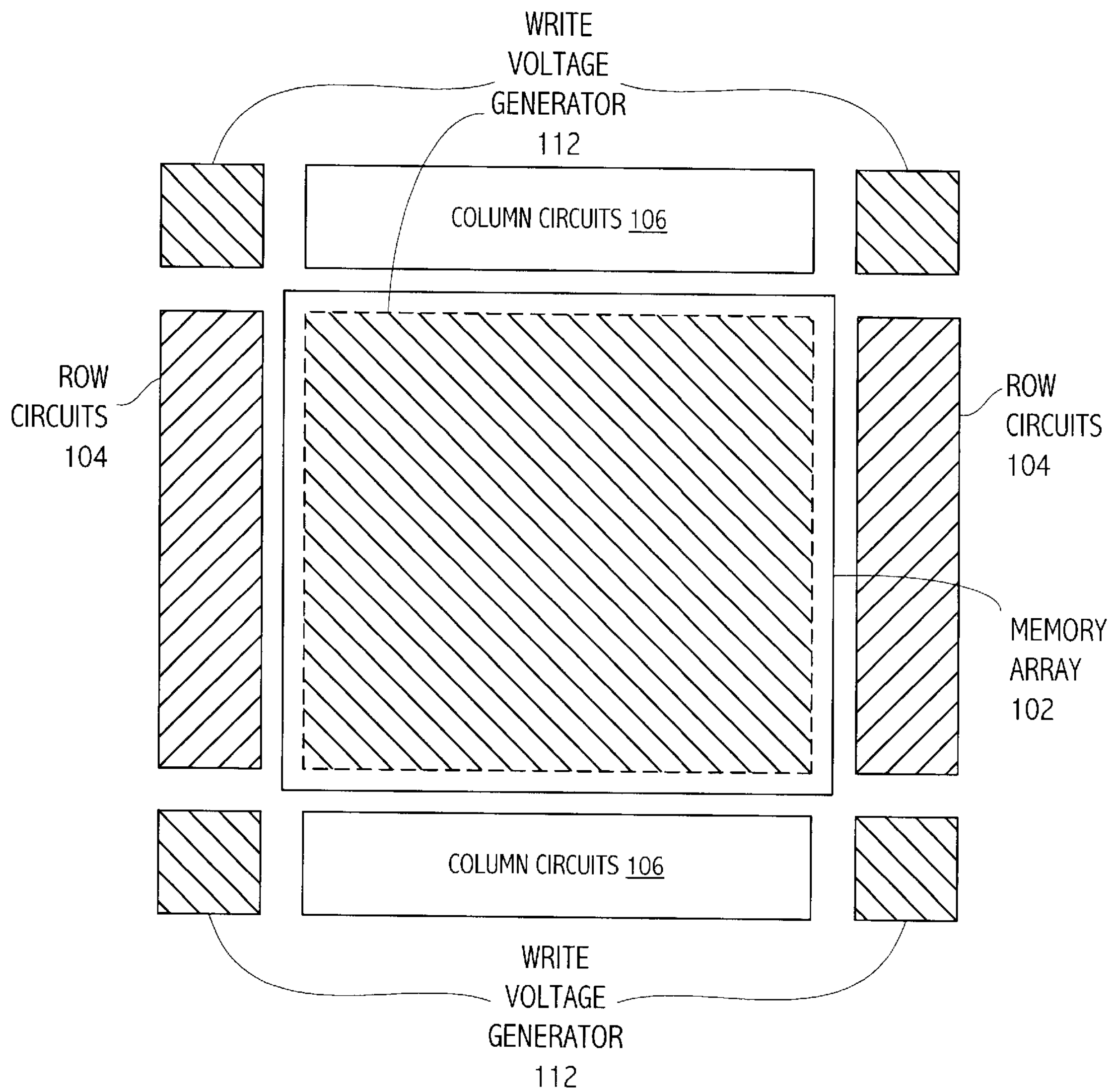
FIG. 4 is a block diagram of a physical layout arrangement of a memory array and associated circuitry, including an on-chip voltage generator, in accordance with a preferred embodiment of the present invention.

Referring now to FIG. 4, another embodiment of an integrated circuit layout is depicted which shows a portion of the write voltage generator 112 occupying substantially the entire layout area beneath the memory array 102. Other respective portions of the write voltage generator 112 are located near and outside the four respective corners of the memory array 102. Since the voltage generator 112 occupies so much of the layout area beneath the memory array 102, the column circuits blocks 106 are implemented in two halves, as before, each located outside the extent of the memory array 102. The row circuits block 104 is likewise implemented in two halves, each located outside the extent of the memory array 102. By moving both the row circuits block 104 and the column circuits block 106 outside the extent of the memory array 102, additional layout area may be allocated for use by the write voltage generator 112. If additional layout area is required by the voltage generator 112, additional area may be allocated near the memory array 102, or alternatively, may be allocated distant from the memory array 102. For example, if using a charge pump circuit, the pump stages may be located distant from the memory array, while the area beneath the array may be used for filtration capacitance for the write voltage.

Figure 5:
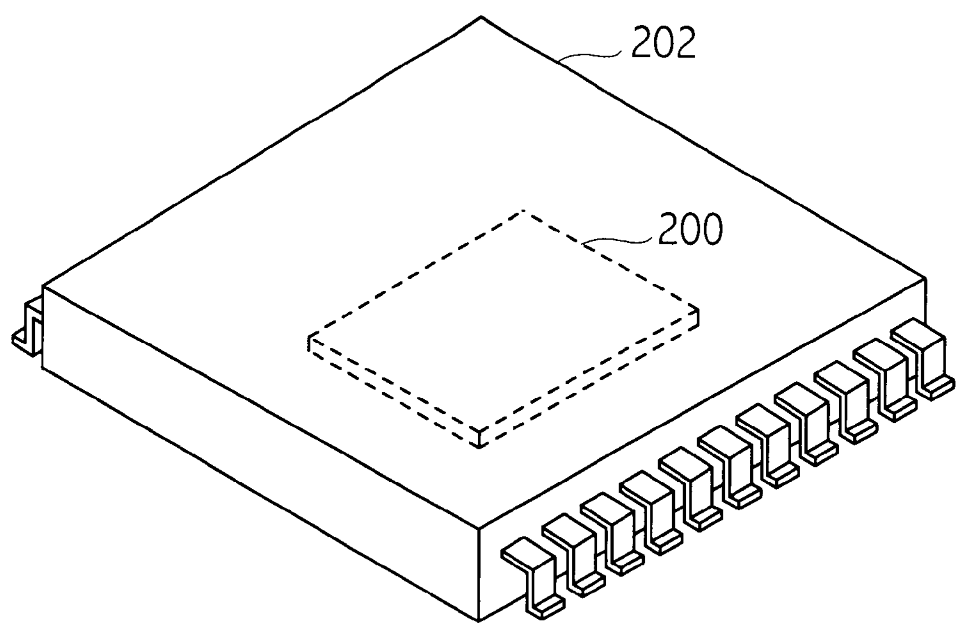
FIG. 5 is an isometric drawing of an integrated circuit contained within an integrated circuit package, in accordance with a preferred embodiment of the present invention.

Referring now to FIG. 5, an integrated circuit 200 in accordance with the present invention is depicted within a semiconductor package 202. Many packaging techniques and materials are well known in the art. Many available packaging materials are opaque to various wavelengths of light. Suitable packaging material may be chosen to prevent the erasure of memory cells therewithin, even if such memory cells are implemented using a fundamentally erasable memory cell technology, such as ultra-violet erasable programmable read-only-memory (i.e., UV EPROM) memory cells. Alternatively, a device such as a flash EEPROM could be tested by reading and erasing various bits, then could be programmed to disable subsequent erase commands. As another alternative, such a device may be packaged without bringing all electrical signals (e.g., I/O pins) to a corresponding external package pin so that an erase command, otherwise available and used for testing of the die, is lost when packaged. Other memory cell technologies which are fundamentally erasable may be incorporated within a device which, as to a user thereof, appears to be a write-once memory if such memory cells are prevented from erasure or further programming.

While the invention has been described above in the context of these several exemplary embodiments, the invention is not be limited to such embodiments. For example, the invention is not limited to arrays of two-terminal memory cells, but rather may be advantageously utilized with three-terminal memory cells, such as Flash EEPROM technology. Moreover, while non-volatile memory arrays incorporating antifuse memory cells are believed to be particularly advantageous for use with the present invention, other non-volatile memory arrays, such as those incorporating fuse memory cells, may also be used. Furthermore, volatile memory cell arrays are also advantageously contemplated in certain embodiments.

While certain of the embodiments described above refer to locating at least a portion of a write voltage generator circuit beneath the memory array, the invention also contemplates locating the write voltage generator circuit above the memory array, such as, for example, within a polysilicon layer or recrystallized polysilicon layer, or within some other layer suitable for forming thin film transistors. Moreover, the invention is not contemplated to be limited to traditional silicon semiconductor technologies, as other suitable semiconductor technologies, such as gallium arsenide, silicon carbide, indium phosphide, as well as certain organic structures, may take advantage of the teachings herein.

In the above described embodiments, the read and write voltages are shown being conveyed to (or generated within) the row circuits block 104, but this is not necessarily required. Such voltages could equivalently be provided to a column circuits block 106, or alternatively, the read voltage be provided to one of the row circuits block 104 and the column circuits block 106, and the write voltage be provided to the other of the row circuits block 104 and column circuits block 106. Moreover, the write voltage need not be fully passed without any voltage drop to the memory array or to selected memory cells therewithin. For example, a row circuits block 104 may be configured to convey to a selected word line of the memory array 102 a voltage which is substantially equal to the voltage generated by the voltage generator 112. As used herein, such a circuit nonetheless provides the write voltage to the selected memory cells.

General Terminology

Regarding general terminology used herein, it will be appreciated by one skilled in the art that any of several expressions may be equally well used when describing the operation of a circuit including the various signals and nodes within the circuit. Any kind of signal, whether a logic signal or a more general analog signal, takes the physical form of a voltage level (or for some circuit technologies, a current level) of a node within the circuit. It may be correct to think of signals being conveyed on wires or buses. For example, one might describe a particular circuit operation as "the output of circuit 10 drives the voltage of node 11 toward VDD, thus asserting the signal OUT conveyed on node 11." This is an accurate, albeit somewhat cumbersome expression. Consequently, it is well known in the art to equally describe such a circuit operation as "circuit 10 drives node 11 high," as well as "node 11 is brought high by circuit 10," "circuit 10 pulls the OUT signal high" and "circuit 10 drives OUT high." Such shorthand phrases for describing circuit operation are more efficient to communicate details of circuit operation, particularly because the schematic diagrams in the figures clearly associate various signal names with the corresponding circuit blocks and node names. For convenience, an otherwise unnamed node conveying the CLK signal may be referred to as the CLK node. Similarly, phrases such as "pull high," "drive high," and "charge" are generally synonymous unless otherwise distinguished, as are the phrases "pull low," "drive low," and "discharge." It is believed that use of these more concise descriptive expressions enhances clarity and teaching of the disclosure. It is to be appreciated by those skilled in the art that each of these and other similar phrases may be interchangeably used to describe common circuit operation, and no subtle inferences should be read into varied usage within this description.

Regarding power supplies, a single positive power supply voltage (e.g., a 2.5 volt power supply) used to power a circuit is frequently named the "VDD" power supply. In an integrated circuit, transistors and other circuit elements are actually connected to a VDD terminal or a VDD node, which is then operably connected to the VDD power supply. The colloquial use of phrases such as "tied to VDD" or "connected to VDD" is understood to mean "connected to the VDD node", which is typically then operably connected to actually receive the VDD power supply voltage during use of the integrated circuit.

The reference voltage for such a single power supply circuit is frequently called "VSS." Transistors and other circuit elements are actually connected to a VSS terminal or a VSS node, which is then operably connected to the VSS power supply during use of the integrated circuit. Frequently the VSS terminal is connected to a ground reference potential, or just "ground." Describing a node which is "grounded" by a particular transistor or circuit (unless otherwise defined) means the same as being "pulled low" or "pulled to ground" by the transistor or circuit.

Generalizing somewhat, the first power supply terminal is frequently named "VDD", and the second power supply terminal is frequently named "VSS." Both terms may appear either using subscripts (e.g., VDD) or not. Historically the nomenclature "$V_{DD}$" implied a DC voltage connected to the drain terminal of an MOS transistor and $V_{SS}$ implied a DC voltage connected to the source terminal of an MOS transistor. For example, old PMOS circuits used a negative VDD power supply, while old NMOS circuits used a positive VDD power supply. Common usage, however, frequently ignores this legacy and uses VDD for the more positive supply voltage and VSS for the more negative (or ground) supply voltage unless, of course, defined otherwise. Describing a circuit as functioning with a "VDD supply" and "ground" does not necessarily mean the circuit cannot function using other power supply potentials. Other common power supply terminal names are "VCC" (a historical term from bipolar circuits and frequently synonymous with a +5 volt power supply voltage, even when used with MOS transistors which lack collector terminals) and "GND" or just "ground."

The block diagrams herein may be described using the terminology of a single node connecting the blocks. Nonetheless, it should be appreciated that, when required by the context, such a "node" may actually represent a pair of nodes for conveying a differential signal, or may represent multiple separate wires (e.g., a bus) for carrying several related signals or for carrying a plurality of signals forming a digital word.

While the invention has been largely described with respect to the embodiments set forth above, the invention is not necessarily limited to these embodiments. Variations and modifications of the embodiments disclosed herein may be made based on the description set forth herein, without departing from the scope and spirit of the invention as set forth in the following claims. Accordingly, other embodiments, variations, and improvements not described herein are not necessarily excluded from the scope of the invention, which is defined by the following appended claims.

What is claimed is:

1. An integrated circuit device comprising:

a three-dimensional array of memory cells; and array terminal circuitry coupled to the memory array for providing to at least one selected memory cell of the array a read voltage to read the at least one selected memory cell and a write voltage to write the at least one selected memory cell; and a voltage generator circuit to generate the write voltage.

2. The integrated circuit device as recited in claim 1 wherein the memory cells comprise non-volatile memory cells.

3. The integrated circuit device as recited in claim 2 wherein the memory cells comprise write-once memory cells.

4. The integrated circuit device as recited in claim 2 wherein the memory cells comprise erasable memory cells.

5. The integrated circuit device as recited in claim 1 wherein the memory cells comprise volatile memory cells.

6. The integrated circuit device as recited in claim 1 wherein:

the memory cells comprise non-volatile memory cells; and the integrated circuit device includes a semiconductor package which is arranged to prevent erasure of memory cells by a user thereof, even if the memory cells are fundamentally erasable.

7. The integrated circuit device as recited in claim 1 wherein:

the memory cells comprise non-volatile memory cells; and the integrated circuit device includes a semiconductor package which is arranged to prevent additional programming of memory cells by a user thereof.

8. The integrated circuit device as recited in claim 1 wherein:

the memory cells comprise non-volatile memory cells; and the integrated circuit device includes a write-protect capability which, when enabled, prevents erasure of memory cells by a user thereof, even if the memory cells are fundamentally erasable.

9. The integrated circuit device as recited in claim 1 wherein:

the memory cells comprise non-volatile memory cells; and the integrated circuit device includes a write-protect capability which, when enabled, prevents additional programming of memory cells by a user thereof.

10. The integrated circuit device as recited in claim 1 wherein:

each of the memory cells comprises a non-volatile two-terminal memory cell.

11. The integrated circuit device as recited in claim 1 wherein:

each of the memory cells comprises a non-volatile three-terminal memory cell.

12. The integrated circuit device as recited in claim 1 wherein:

the memory cells comprise non-volatile, write-once memory cells; and each of the memory cells comprises a two-terminal anti-fuse memory cell.

13. The integrated circuit device as recited in claim 1 wherein:

the memory cells comprise non-volatile, write-once memory cells; and each of the memory cells comprises a two-terminal fuse memory cell.

14. The integrated circuit device as recited in claim 1 wherein:

the integrated circuit device is arranged to operably receive an externally-provided power supply voltage; and at least one of the read and write voltages is greater than the power supply voltage.

15. The integrated circuit device as recited in claim 14 wherein:

neither the read voltage nor the write voltage is substantially equal to the power supply voltage.

16. The integrated circuit device as recited in claim 14 wherein:

the voltage generator circuit is arranged to operably receive the externally-provided power supply voltage and to generate the write voltage at a magnitude greater than the power supply voltage.

17. The integrated circuit device as recited in claim 16 wherein the voltage generator circuit comprises a capacitive voltage multiplier circuit.

18. The integrated circuit device as recited in claim 16 wherein the voltage generator circuit comprises an inductive voltage transformation circuit.

19. The integrated circuit device as recited in claim 16 wherein the voltage generator circuit is arranged such that at least a portion thereof is physically disposed beneath the memory array.

20. The integrated circuit device as recited in claim 19 wherein the at least a portion of the voltage generator circuit physically disposed beneath the memory array includes circuit structures formed within a semiconductor substrate.

21. The integrated circuit device as recited in claim 16 wherein the voltage generator circuit is arranged such that at least a portion thereof is physically disposed above the memory array.

22. An integrated circuit arranged to operably receive an externally-provided power supply voltage comprising:

a three-dimensional array of non-volatile memory cells, the array having at least more than one layer of word lines or more than one layer of bit lines;

array terminal circuitry coupled to the memory array for providing to at least one selected memory cell a read voltage to read the at least one selected memory cell and a write voltage different from the read voltage to write the at least one selected memory cell, the write voltage being greater than the externally-provided power supply voltage; and a voltage generator circuit arranged to operably receive the externally-provided power supply voltage and to generate the write voltage.

23. The integrated circuit as recited in claim 22 wherein:

the memory cells comprise write-once memory cells; and each of the memory cells comprises a two-terminal antifuse memory cell.

24. The integrated circuit as recited in claim 22 wherein the voltage generator circuit comprises a capacitive voltage multiplier circuit arranged such that at least a portion thereof is physically disposed beneath the memory array.

25. The integrated circuit as recited in claim 22 wherein:

each of the memory cells comprises a write-once, two-terminal, antifuse memory cell; and the voltage generator circuit comprises a capacitive voltage multiplier circuit arranged such that at least a portion thereof is physically disposed beneath the memory array.

26. An integrated circuit comprising,:

an array of memory cells; and a voltage generator circuit arranged to operably receive an externally-provided power supply voltage and to generate a write voltage for the array;

wherein at least a portion of the voltage generator circuit is physically disposed within a lateral extent of the memory array.

27. The integrated circuit as recited in claim 26 wherein the at least a portion of the voltage generator circuit physically disposed within the lateral extent of the memory array is located below the memory array.

28. The integrated circuit as recited in claim 27 wherein the portion of the voltage generator circuit located below the memory array includes transistors formed within a semiconductor substrate.

29. The integrated circuit as recited in claim 27 wherein the portion of the voltage generator circuit located below the memory array includes no transistors formed within a semiconductor substrate.

30. The integrated circuit as recited in claim 26 wherein the at least a portion of the voltage generator circuit physically disposed within the lateral extent of the memory array is located above the memory array.

31. The integrated circuit as recited in claim 30 wherein the portion of the voltage generator circuit located above the memory array includes thin-film transistors.

32. The integrated circuit as recited in claim 30 wherein the portion of the voltage generator circuit located above the memory array includes polysilicon transistors.

33. The integrated circuit as recited in claim 26 wherein the voltage generator circuit comprises a capacitive voltage multiplier circuit.

34. The integrated circuit as recited in claim 26 wherein:

the memory array comprises a three-dimensional memory array.

35. The integrated circuit as recited in claim 26 wherein:

the memory array comprises a three-dimensional memory array having at least two layers of word lines and at least two layers of bit lines.

36. An integrated circuit device comprising:

a three-dimensional array of non-volatile memory cells; and a write-protect capability which, when enabled, prevents alteration of memory cells by a user thereof, even if the memory cells are fundamentally erasable.

37. The integrated circuit device as recited in claim 36 wherein each of the memory cells comprises a non-volatile two-terminal memory cell.

38. The integrated circuit device as recited in claim 36 wherein each of the memory cells comprises a non-volatile three-terminal memory cell.

39. The integrated circuit device as recited in claim 36 wherein each of the memory cells comprises a non-volatile, write-once, two-terminal, antifuse memory cell.

40. The integrated circuit device as recited in claim 36 wherein each of the memory cells comprises a non-volatile, write-once, two-terminal, fuse memory cell.

41. An integrated circuit device arranged to operably receive an externally-provided power supply voltage, said integrated circuit device comprising:

a three-dimensional array of memory cells; and array terminal circuitry coupled to the memory array for providing to at least one selected memory cell of the array a read voltage to read the at least one selected memory cell and a write voltage different from the read voltage to write the at least one selected memory cell, at least one of the read and write voltages being greater than the externally-provided power supply voltage.

42. The integrated circuit device as recited in claim 41 wherein:

neither the read voltage nor the write voltage is substantially equal to the externally-provided power supply voltage.

43. An integrated circuit device comprising:

a three-dimensional array of memory cells;

array terminal circuitry coupled to the memory array for providing, to at least one selected memory cell of the array a read voltage to read the at least one selected memory cell and a write voltage different from the read voltage to write the at least one selected memory cell; and a voltage generator circuit arranged to operably receive an externally-provided power supply voltage and to generate the write voltage at a magnitude greater than the externally-provided power supply voltage.

44. The integrated circuit device as recited in claim 43 wherein the voltage generator circuit comprises a capacitive voltage multiplier circuit.

45. The integrated circuit device as recited in claim 43 wherein the voltage generator circuit comprises an inductive voltage transformation circuit.

46. An integrated circuit device comprising:

a three-dimensional array of memory cells;

array terminal circuitry coupled to the memory array for providing to at least one selected memory cell of the array a read voltage to read the at least one selected memory cell and a write voltage different from the read voltage to write the at least one selected memory cell; and a voltage generator circuit arranged to operably receive an externally-provided power supply voltage and to generate the write voltage at a magnitude greater than the externally-provided power supply voltage, at least a portion of the voltage generator circuit being physically disposed beneath the memory array.

47. The integrated circuit device as recited in claim 46 wherein the voltage generator circuit includes circuit structures formed within a semiconductor substrate beneath the memory array.

48. The integrated circuit device as recited in claim 46 wherein the voltage generator circuit includes circuit structures formed above the memory array.

49. An integrated circuit comprising:

an array of memory cells; and a voltage generator circuit arranged to operably receive an externally-provided power supply voltage and to generate a write voltage for the array;

wherein at least a portion of the voltage generator circuit is physically disposed in a semiconductor layer above the memory array.

50. The integrated circuit as recited in claim 49 wherein the portion of the voltage generator circuit located above the memory array includes thin-film transistors.

51. The integrated circuit as recited in claim 49 wherein the portion of the voltage generator circuit located above the memory array includes polysilicon transistors.

* * * * *